(12) United States Patent
Tångring et al.

(10) Patent No.: US 12,261,258 B2
(45) Date of Patent: Mar. 25, 2025

(54) OPTOELECTRONIC COMPONENT AND METHOD FOR PRODUCING AN OPTOELECTRONIC COMPONENT (71) Applicant: OSRAM OLED GmbH, Regensburg (DE)

(72) Inventors: Ivar Tångring, Regensburg (DE); Markus Richter, Burglengenfeld (DE)

(73) Assignee: OSRAM OLED GmbH, Regensburg (DE)

( * ) Notice: Subject to any disclaimer, the term of this patent is extended or adjusted under 35 U.S.C. 154(b) by 694 days.

(21) Appl. No.: 17/262,118

(22) PCT Filed: Aug. 7, 2019

(86) PCT No.: PCT/EP2019/071268
§ 371 (c)(1),
(2) Date: Jan. 21, 2021

(87) PCT Pub. No.: WO2020/038723
PCT Pub. Date: Feb. 27, 2020

(65) Prior Publication Data
US 2021/0265545 A1    Aug. 26, 2021

(30) Foreign Application Priority Data
Aug. 22, 2018    (DE) .......................... 10 2018 120 491

(51) Int. Cl.
*H01L 33/62*    (2010.01)
*H01L 25/16*    (2023.01)
(Continued)

(52) U.S. Cl.
CPC ............ *H01L 33/62* (2013.01); *H01L 25/167* (2013.01); *H01L 27/156* (2013.01);
(Continued)

(58) Field of Classification Search
None
See application file for complete search history.

(56) References Cited

U.S. PATENT DOCUMENTS

2006/0091416 A1* 5/2006 Yan ...................... H01L 25/0753
257/E25.02
2007/0035022 A1* 2/2007 Yuzawa .................. H01L 24/11
257/737
(Continued)

FOREIGN PATENT DOCUMENTS

KR    20150138759 A    12/2015
TW    201419958 A    5/2014

*Primary Examiner* — Xiaoming Liu
(74) *Attorney, Agent, or Firm* — Slater Matsil, LLP (57) ABSTRACT

In an embodiment an optoelectronic component includes a semiconductor chip having an electrical contact, the semiconductor chip configured to emit primary electromagnetic radiation, a carrier having an electrically conductive coating on which the semiconductor chip with the electrical contact is arranged, a contact agent connecting the electrically conductive coating of the carrier and the electrical contact of the semiconductor chip with one another and a passivation layer arranged in places on the electrically conductive coating, wherein an outer surface of the electrically conductive coating is completely encapsulated by the passivation layer and the contact agent, wherein the passivation layer has a penetration, wherein the contact agent protrudes beyond the penetration in a lateral direction, and wherein the semiconductor chip is a flip chip.

20 Claims, 6 Drawing Sheets

(51) Int. Cl.
*H01L 27/15* (2006.01)
*H01L 33/00* (2010.01)
*H01L 33/46* (2010.01)

(52) U.S. Cl.
CPC ............ *H01L 33/005* (2013.01); *H01L 33/46* (2013.01); *H01L 2933/0025* (2013.01); *H01L 2933/0066* (2013.01)

(56) References Cited

U.S. PATENT DOCUMENTS

| | | | |
|---|---|---|---|
| 2009/0072404 A1* | 3/2009 | Kikuchi | H01L 23/5283 257/E23.141 |
| 2010/0207271 A1* | 8/2010 | Omi | H01L 24/05 257/737 |
| 2011/0006322 A1 | 1/2011 | Li et al. | |
| 2012/0061823 A1* | 3/2012 | Wu | H01L 24/13 257/E21.59 |
| 2013/0020590 A1 | 1/2013 | Lin et al. | |
| 2013/0062755 A1* | 3/2013 | Kuo | H01L 24/14 257/737 |
| 2015/0060911 A1* | 3/2015 | Chien | H10K 50/84 438/27 |
| 2016/0027977 A1 | 1/2016 | Seo et al. | |
| 2018/0233496 A1* | 8/2018 | Yoo | H01L 25/167 |

* cited by examiner

OPTOELECTRONIC COMPONENT AND METHOD FOR PRODUCING AN OPTOELECTRONIC COMPONENT

This patent application is a national phase filing under section 371 of PCT/EP2019/071268, filed Aug. 7, 2019, which claims the priority of German patent application 102018120491.4, filed Aug. 22, 2018, each of which is incorporated herein by reference in its entirety.

TECHNICAL FIELD

An optoelectronic component is specified. In addition, a method for producing an optoelectronic component is specified.

SUMMARY

Embodiments provide an optoelectronic component which is particularly efficient and resistant to aging. Further embodiments provide a method for producing such an optoelectronic component.

According to at least one embodiment, the optoelectronic component comprises a radiation-emitting semiconductor chip comprising an electrical contact. The radiation-emitting semiconductor chip is configured to emit primary electromagnetic radiation via a radiation emission surface during operation. The primary electromagnetic radiation can be, for example, near-ultraviolet radiation, visible light, and/or near-infrared radiation.

The radiation-emitting semiconductor chip can be, for example, a surface emitter in which the majority of the emitted primary radiation, for example, over 80% of a radiation power, exits via the radiation emission surface, which is comprised by a first main surface of the radiation-emitting semiconductor chip.

The surface emitter can be, for example, a thin film chip. Thin film chips typically have an epitaxially grown semiconductor layer sequence with an active primary radiation generating region deposited on a different carrier element than the growth substrate for the semiconductor layer sequence. Particularly preferably, a mirror layer is arranged between the semiconductor layer sequence and the carrier element, which directs primary radiation of the active region to the first main surface. Thin film chips generally do not emit the primary electromagnetic radiation generated in the active region during operation via the side surfaces of the carrier element, but have a substantially Lambertian radiation pattern. For example, the thin film chip has an electrical contact on the first main surface.

Further, the radiation-emitting semiconductor chip can be a substrate-less semiconductor chip that is free of a carrier element and a growth substrate. For example, the substrate-less semiconductor chip has a thickness between 5 micrometres and 50 micrometres, inclusive.

Further, the radiation-emitting semiconductor chip can be a volume emitting semiconductor chip that emits the emitted primary radiation not only over the first main surface but also over at least one side surface. For example, in a volume-emitting semiconductor chip, at least 30% radiation power of the emitted primary radiation exits through the at least one side surface.

A volume-emitting semiconductor chip preferably has a substrate on which a semiconductor layer sequence having an active region that generates the primary electromagnetic radiation during operation is grown typically epitaxially on a first main surface. For example, the substrate can comprise or be made of any of the following materials: Sapphire, Silicon Carbide. If the substrate is a sapphire substrate, two electrical contacts of the volume emitting semiconductor chip are preferably arranged on the first main surface of the semiconductor chip. For example, the volume emitting semiconductor chip can be electrically contacted by bonding wires via the two electrical contacts.

For example, the volume-emitting semiconductor chip can be a flip chip. Two electrical contacts are typically arranged on the second main surface of the substrate of the flip chip, which are provided for electrically contacting the semiconductor chip. The two electrical contacts are arranged spaced apart from one another in the lateral direction.

According to at least one embodiment, a second main surface of the radiation-emitting semiconductor chip opposite the first main surface comprises the electrical contact. The electrical contact preferably comprises or consists of a metal. The metal preferably comprises one of the following materials: copper, gold, platinum, titanium.

According to at least one embodiment, the radiation-emitting semiconductor chip is surface mountable.

According to at least one embodiment, the optoelectronic component comprises a carrier comprising an electrically conductive coating and on which the radiation-emitting semiconductor chip with the electrical contact is arranged. Furthermore, the carrier comprises a carrier plate on which the electrically conductive coating is arranged. The carrier plate is formed of or comprises, for example, a metallic and/or ceramic material. The carrier is or comprises, for example, a circuit board or a lead frame.

According to one embodiment, the electrically conductive coating forms an outer surface of the carrier facing the radiation-emitting semiconductor chip. The electrical contact is electrically conductively connected to the electrically conductive coating at least in regions. The region of the electrically conductive coating in which the electrical contact is electrically conductively connected to the electrically conductive coating preferably forms a contact point.

Furthermore, it is possible, for example, for a flip chip, that a first electrical contact and a second electrical contact are arranged on the second main surface of the radiation-emitting semiconductor chip. In this case, the electrically conductive coating is preferably formed in two pieces and comprises a first electrically conductive coating and a second electrically conductive coating.

The carrier preferably has a main extension plane. The vertical direction extends perpendicular to the main extension plane and the lateral direction extends parallel to the main extension plane.

The first electrically conductive coating is preferably spaced apart from the second electrically conductive coating in a lateral direction. The first electrically conductive coating and the second electrically conductive coating are preferably in a common plane. The first electrical contact is preferably in electrically conductive contact with the first electrically conductive coating, at least in regions. The second electrical contact is preferably at least in regions in electrically conductive contact with the second electrically conductive coating. The region of the first electrically conductive coating and the region of the second electrically conductive coating in which the first electrical contact and the second electrical contact are electrically conductively connected to the electrically conductive coating preferably form a first contact point and a second contact point, respectively.

The electrically conductive coating preferably comprises or consists of a metal. The metal is particularly preferably silver. In addition, gold and/or copper are also suitable for the electrically conductive coating. For example, the electrically conductive coating can be formed of copper coated with silver or gold.

According to at least one embodiment, the optoelectronic component comprises a contact agent connecting the electrically conductive coating of the carrier and the electrical contact of the semiconductor chip. Preferably, the contact agent is a solder. In addition, the contact agent can also be an electrically conductive adhesive. Preferably, the contact agent is arranged between the electrical contact and the electrically conductive coating. By means of the contact agent, the electrical contact and the electrically conductive coating are preferably electrically conductively connected. Furthermore, the contact agent mediates an attachment of the radiation-emitting semiconductor chip to the carrier. The contact agent preferably comprises or consists of a metal. The metal is particularly preferably a solderable metal. Furthermore, the contact agent preferably has a thickness of at least 500 nanometres.

According to at least one embodiment, the optoelectronic component comprises a passivation layer arranged in places on the electrically conductive coating. Preferably, the passivation layer is in direct contact with the electrically conductive coating. Preferably, the passivation layer covers a major part of a main surface of the electrically conductive coating.

Furthermore, the passivation layer preferably covers at least one side surface of the electrically conductive coating. Particularly preferably, the passivation layer completely covers all side surfaces of the electrically conductive coating.

Preferably, the passivation layer has a thickness of at most 500 nanometres. Furthermore, the passivation layer exhibits a comparatively low permeability to moisture and corrosive gases.

According to a preferred embodiment, an outer surface of the electrically conductive coating is completely encapsulated by the passivation layer and the contact agent. Preferably, the outer surface of the electrically conductive coating facing away from the carrier plate is completely encapsulated by the passivation layer and the contact agent. Preferably, the main surface of the electrically conductive coating and at least one side surface adjacent thereto are mainly covered by the passivation layer. The surface of the electrically conductive coating not covered by the passivation layer is preferably completely covered by the contact agent.

Furthermore, an outer surface of the electrically conductive coating facing the carrier plate is preferably arranged on the carrier plate and is preferably in direct contact therewith. The complete outer surface of the electrically conductive coating is thus three-dimensionally encapsulated by the passivation layer, the contact agent and the carrier plate.

According to one embodiment, the optoelectronic component comprises a radiation-emitting semiconductor chip comprising an electrical contact, a carrier comprising an electrically conductive coating and on which the radiation-emitting semiconductor chip with the electrical contact is arranged. Further, in this embodiment, the optoelectronic component comprises a contact agent connecting the electrically conductive coating of the carrier and the electrical contact of the semiconductor chip, and a passivation layer arranged in places on the electrically conductive coating, wherein an outer surface of the electrically conductive coating is completely encapsulated by the passivation layer and the contact agent.

One idea of the optoelectronic component described herein is, inter alia, to protect an electrically conductive coating of a carrier by means of a passivation layer. Typically, the electrically conductive coating comprises silver. However, silver is susceptible to corrosion in humid environments. Advantageously, the passivation layer protects the electrically conductive coating from external influences, such as water, and thus increases the operating life of the optoelectronic component. Furthermore, contact points of the electrically conductive coating are generally free of the passivation layer. Advantageously, a contact agent is arranged in the region of the electrically conductive coating, which completely encapsulates the electrically conductive coating with the passivation layer. Advantageously, this further increases the operating life of such an optoelectronic component.

According to at least one embodiment, the passivation layer has a penetration so that a contact point of the electrically conductive coating is accessible. The penetration preferably penetrates the passivation layer completely. In the region of the penetration, the electrically conductive coating is free of the passivation layer. The region of the electrically conductive coating that is free of the passivation layer can thus be in electrically conductive contact with the electrical contact and forms the contact point.

Furthermore, it is possible that the first electrically conductive coating and the second electrically conductive coating each have a first penetration and a second penetration, so that the first contact point and the second contact point of the first electrically conductive coating and the second electrically conductive coating are accessible, respectively.

According to at least one embodiment, the penetration is completely filled with the contact agent. At least one side surface of the passivation layer in the region of the penetration and the main surface of the electrically conductive coating in the region of the penetration are preferably in direct contact with the contact agent. Furthermore, it is possible that the contact agent protrudes beyond the penetration in the vertical direction.

According to at least one embodiment, the electrically conductive coating is reflective for a primary radiation emitted by the radiation-emitting semiconductor chip, preferably specularly reflective. Preferably, the electrically conductive coating has a reflectivity of at least 90% for the primary electromagnetic radiation generated by the radiation-emitting semiconductor chip.

Particularly preferably, the electrically conductive coating comprises silver or is formed from silver. Silver is advantageously formed to be comparatively highly reflective for blue light. For example, if the radiation-emitting semiconductor chip is formed volume-emitting and suitable for emitting blue light as primary electromagnetic radiation, the blue light can be emitted via the side surface of the semiconductor chip in the direction of the carrier. The highly reflective electrically conductive coating is advantageously configured to direct the blue light emitted in the direction of the carrier to a light extraction surface of the component. Thus, advantageously, an increased light extraction and efficiency of the optoelectronic component can be achieved.

According to at least one embodiment, the passivation layer comprises a layer stack. Preferably, the layer stack comprises at least two layers, for example a first layer and a second layer. Preferably, the first layer and the second layer are different from one another. For example, the first layer and the second layer differ with respect to their materials. For example, the following materials are suitable for the first layer and/or the second layer: $SiO_2$, $MgF_2$ and $Al_2O_3$.

Particularly preferably, the first layer and the second layer, each of which may comprise $SiO_2$, $MgF_2$ or $Al_2O_3$ or be made of one of these materials, are arranged alternately. In particular preferably, the first layer comprises $SiO_2$ and the second layer comprises $Al_2O_3$. Preferably, a passivation layer with a high reflectivity can be obtained in this way.

According to at least one embodiment, the passivation layer is arranged for the most part on the electrically conductive coating. Particularly preferably, the passivation layer covers at least 90% of the main surface of the electrically conductive coating. Particularly preferably, the passivation layer covers at least 95% of the main surface of the electrically conductive coating.

Alternatively, it is possible that the contact agent covers the most part of the electrically conductive coating. In this case, only a small part is covered by the passivation layer. In this case, the passivation layer preferably covers at most 50% of the main surface of the electrically conductive coating.

According to at least one embodiment, the contact agent protrudes beyond the penetration in the lateral direction. A main surface of the passivation layer facing away from the electrically conductive coating is preferably covered by the contact agent in the region surrounding the penetration. In this region protruding in the lateral direction, the contact agent is in direct contact with the passivation layer. The contact agent thus overmolds the passivation layer in the region of the penetration, preferably continuously. As a result of the overmolding, the electrically conductive coating is advantageously particularly well protected against external chemical influences.

According to at least one embodiment, a metal layer is arranged in the penetration between the contact agent and the electrically conductive coating. Preferably, the metal layer completely covers the contact point or the freely accessible electrically conductive coating and is in direct contact therewith. The metal layer can terminate flush with the main surface of the passivation layer. Alternatively, it is possible that the metal layer is arranged up to a certain height in the vertical direction in the penetration, so that the at least one side surface of the penetration is only partially covered by the metal layer. Furthermore, it is possible that the metal layer protrudes beyond the penetration in the vertical direction.

The metal layer can provide an additional barrier effect against external chemical influences. Advantageously, the protection provided by the electrically conductive coating can thus be increased.

According to at least one embodiment, a side surface of the electrically conductive coating is free of the passivation layer. The side surface of the electrically conductive coating that is free of the passivation layer preferably overlaps with the radiation-emitting semiconductor chip in plan view. The side surface is thus preferably located between the radiation-emitting semiconductor chip and the carrier plate. In this case, the passivation layer preferably covers the main surface of the electrically conductive coating only up to an edge where the main surface and the side surface of the electrically conductive coating are in contact.

According to at least one embodiment, the side surface of the electrically conductive coating that is free of the passivation layer is completely covered by a potting body. The potting body can be, for example, a resin such as an epoxy or a silicone or a mixture of these materials. Preferably, reflective particles are incorporated into the potting body. Preferably, the reflective particles comprise $TiO_2$ particles. Furthermore, the potting body preferably has a reflectivity of at least 90% for the primary electromagnetic radiation generated by the radiation-emitting semiconductor chip.

The potting body is preferably in direct contact with the side surface of the electrically conductive coating. The outer surface of the electrically conductive coating facing away from the carrier plate is thus preferably completely encapsulated by the passivation layer, the contact agent and the potting body.

According to at least one embodiment, the radiation-emitting semiconductor chip is surrounded by a conversion element that converts primary electromagnetic radiation of the semiconductor chip into secondary electromagnetic radiation of a different wavelength range. The conversion element comprises, for example, a matrix material in which phosphor particles are incorporated. The matrix material can be, for example, a resin such as an epoxy or a silicone or a polysiloxane or a mixture of these materials. Preferably, the phosphor particles thereby impart the wavelength-converting properties to the conversion element.

For the phosphor particles, for example, one of the following materials is suitable: Rare earth doped garnets, rare earth doped alkaline earth sulfides, rare earth doped thiogallates, rare earth doped aluminates, rare earth doped silicates, rare earth doped orthosilicates, rare earth doped chlorosilicates, rare earth doped alkaline earth silicon nitrides, rare earth doped oxynitrides, rare earth doped aluminum oxynitrides, rare earth doped silicon nitrides, rare earth doped sialons, quantum dots. These materials can also be used without matrix material and applied directly. In this case, the matrix material can be applied subsequently.

The conversion element preferably covers the radiation-emitting semiconductor chip and the main surface of the passivation layer. Furthermore, the conversion element is preferably applied by means of a spraying process.

According to at least one embodiment, an optical element is arranged downstream of the radiation-emitting semiconductor chip. Downstream means that the optical element is arranged relative to the radiation-emitting semiconductor chip such that the primary electromagnetic radiation of the semiconductor chip can pass through the optical element. The optical element preferably completely covers the conversion element and is in direct contact therewith.

The optical element can be a lens. For example, the optical element comprises a resin, such as an epoxy or a silicone, or a mixture of these materials. An outer surface of the optical element facing away from the semiconductor chip preferably has a convex or concave shape. By means of the shape of the optical element, the primary and secondary radiation to be coupled out of the optoelectronic component can advantageously be shaped in a desired manner.

According to at least one embodiment, the passivation layer has a smaller refractive index than the optical element and/or the conversion element. Due to the difference in refractive index between the passivation layer and the optical element and/or the conversion element, electromagnetic radiation incident on the passivation layer can be reflected particularly well.

According to at least one embodiment, the electrically conductive coating comprises a first electrically conductive coating and a second electrically conductive coating. In this case, the first electrically conductive coating is preferably spaced apart at most 100 micrometres in the lateral direction from the second electrically conductive coating. Preferably, the first electrically conductive coating and the second electrically conductive coating each have opposing side surfaces that are spaced apart by at most 100 micrometres. The comparatively small distance between the first electrically conductive coating and the second electrically conductive coating advantageously increases the interface area with the carrier plate, and heat generated during operation can be better dissipated from the semiconductor chip and the conversion element.

A method for producing an optoelectronic component is further specified, by which an optoelectronic component described herein can be produced. All features and embodiments disclosed in connection with the optoelectronic component are therefore also applicable in connection with the method, and vice versa.

According to at least one embodiment of the method, a carrier is provided comprising an electrically conductive coating. The carrier further comprises a carrier plate. The carrier plate can be produced, for example, by means of an injection molding or casting process. The electrically conductive coating can be applied to the carrier plate, for example, by electroplating, evaporation, spraying, screen printing, or doctoring.

According to at least one embodiment of the method, a passivation layer is applied to the carrier. The material of the passivation layer can be applied, for example, by chemical or physical vapor deposition, evaporation, spraying, screen printing or doctoring. For example, the passivation layer is structured during or after application.

According to at least one embodiment of the method, a radiation-emitting semiconductor chip comprising an electrical contact is provided.

According to at least one embodiment of the method, the semiconductor chip is connected to the carrier by means of a contact agent. For this purpose, for example, the electrical contact of the semiconductor chip is applied to the electrically conductive coating in regions by bonding or soldering by means of the contact agent. This connection fixes the radiation-emitting semiconductor chip to the carrier in a preferably electrically conductive and/or thermally conductive manner. Furthermore, this connection preferably fixes the radiation-emitting semiconductor chip to the carrier in a mechanically stable manner.

According to at least one embodiment of the method, an outer surface of the electrically conductive coating is completely encapsulated by the passivation layer and the contact agent.

According to at least one embodiment of the method, a penetration is generated in the passivation layer and a contact point of the electrically conductive coating is accessible in the region of the penetration. The penetration can be generated using a mask and an etching process.

According to at least one embodiment of the method, the contact agent is applied to the electrical contact. For example, the contact agent can be applied to the electrical contact by bonding or soldering. When the contact agent is applied to the electrical contact, the contact agent preferably covers at least 50%, in particular preferably at least 80%, of a main surface of the electrical contact. Furthermore, the contact agent is preferably in a viscous form when applied.

According to at least one embodiment of the method, the contact agent is pressed onto the contact point of the electrically conductive coating during the connection so that contact agent protrudes beyond regions of the passivation layer surrounding the penetration. The contact agent preferably protrudes beyond the penetration in the lateral direction and in particular preferably in the vertical direction.

During the connection, the contact agent is preferably pressed centrally into the penetration onto the electrically conductive coating. The contact agent is thereby preferably pressed against the electrically conductive coating with a constant pressure. The contact agent is partially displaced from the penetration by the pressing. The contact agent is thus displaced into the regions of the passivation layer surrounding the penetration, so that the contact agent overmolds the passivation layer in the region of the penetration.

According to at least one embodiment of the method, the semiconductor chip is heated during the connection to the carrier. Heating the semiconductor chip preferably also heats the contact agent, so that the contact agent is shapeable and is in the viscous form.

According to at least one embodiment of the method, a metal layer is deposited on the contact point of the electrically conductive coating by means of an electroplating process prior to the connection. For example, the metallic layer comprises or consists of a metal, wherein the metal has particularly good soldering properties. For example, the metallic layer is applied in the penetration. In this case, the galvanic layer preferably completely fills the penetration in the lateral direction.

According to at least one embodiment of the process, the passivation layer is structured by means of a shadow mask and a physical etching process. Preferably, the passivation layer is deposited completely over or on the carrier. Preferably, the passivation layer completely covers the carrier plate and the electrically conductive coating. By means of the shadow mask and the physical etching process, the penetration in the passivation layer is generated and the passivation layer is thus structured.

According to at least one embodiment of the method, the passivation layer is structured by means of a photoresist mask and a chemical etching process. For example, the passivation layer is completely deposited over the carrier. For example, the photoresist mask can be a positive photoresist that is deposited in a structured manner over the passivation layer. The regions of the passivation layer not covered by the positive photoresist can be removed by the chemical etching process. In a subsequent step, the positive photoresist is removed.

Alternatively, it is possible to apply a negative photoresist completely over or on top of the carrier plate and the electrically conductive coating. Using ultraviolet exposure and further shadow mask, the negative photoresist can be structured so that it is only over the regions where the penetration is to be generated. The passivation layer can subsequently be arranged completely over the carrier plate, the electrically conductive coating and the negative photoresist. Here, the passivation layer is preferably applied to the negative photoresist by means of a directional deposition process. A subsequent removal of the negative photoresist by means of the chemical etching process also results in the removal of the passivation layer arranged over the negative photoresist.

BRIEF DESCRIPTION OF THE DRAWINGS

In the following, the optoelectronic component and the method for producing the optoelectronic component are explained in more detail with reference to the figures with reference to exemplary embodiments.

Identical, similar or similarly acting elements are marked with the same reference signs in the figures. The figures and the proportions of the elements shown in the figures to one another are not to be regarded as true to scale. Rather, individual elements can be oversized for better representability and/or comprehensibility.

DETAILED DESCRIPTION OF ILLUSTRATIVE EMBODIMENTS

Figure 1:
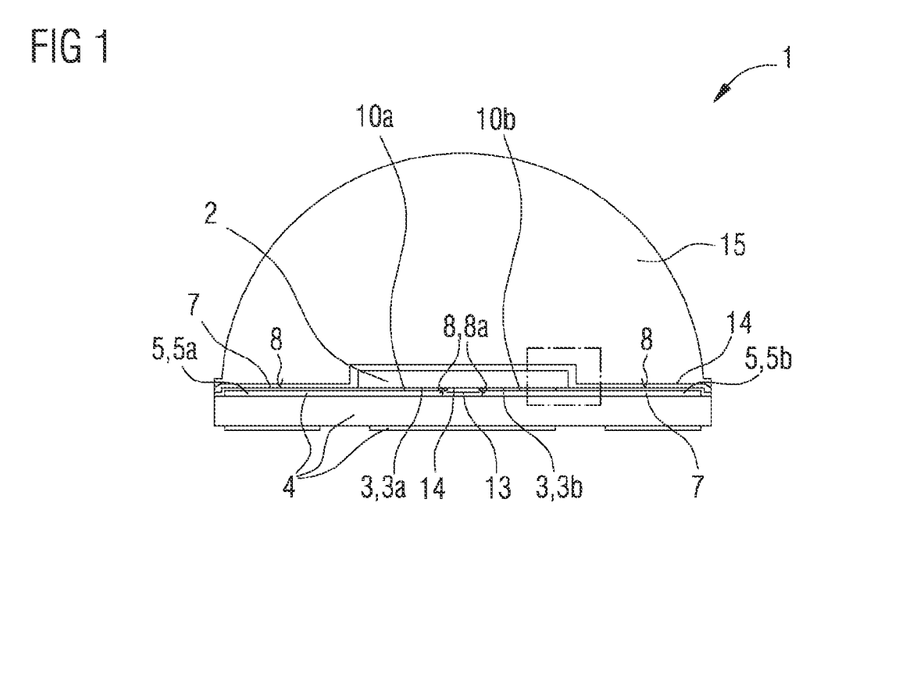
FIGS. 1 and 2 show schematic sectional views of an optoelectronic component according to an exemplary embodiment.
Figure 2:
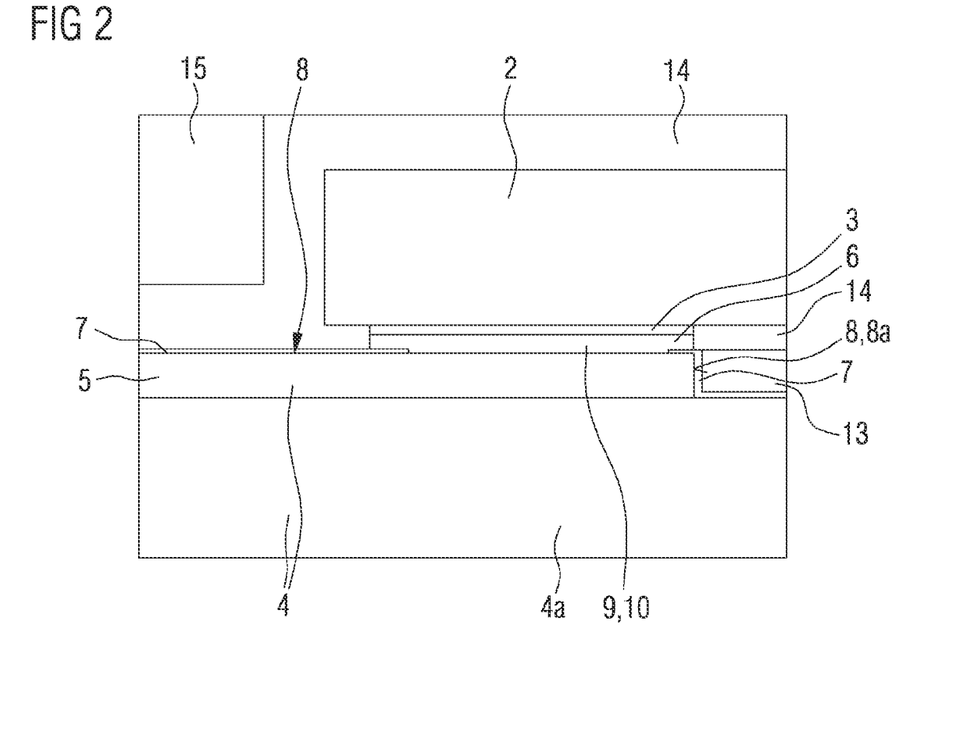

The optoelectronic component 1 according to the exemplary embodiment of FIGS. 1 and 2 comprises a radiation-emitting semiconductor chip 2, which comprises a first electrical contact 3a and a second electrical contact 3b, which are electrically conductively connected to a first electrically conductive coating 5a and a second electrically conductive coating 5b of a carrier 4 by means of a contact agent 6, respectively. The first electrically conductive coating 5a and the second electrically conductive coating form an electrically conductive coating 5. The electrically conductive coating 5 is arranged on a carrier plate 4a.

A conversion element 14 and an optical element 15 are arranged above the radiation-emitting semiconductor chip 2 and the first electrically conductive coating 5a and the second electrically conductive coating 5b.

Further, the first electrically conductive coating 5a and the second electrically conductive coating 5b each have opposing side surfaces 8a arranged between the radiation-emitting semiconductor chip 2 and the carrier plate 4a. A conversion element 14 is also arranged on a second main surface of the radiation-emitting semiconductor chip 2 located in the intermediate space. Further, the intermediate space between the two opposing side surfaces 8a is completely filled with a reflective potting body 13.

A passivation layer 7 is arranged in places between the conversion element 14 and the first electrically conductive coating 5a and the second electrically conductive coating 5b.

An outer surface of the electrically conductive coating 8 is completely encapsulated by the passivation layer 7 and the contact agent 6.

For example, the optical element is formed of a silicone having a refractive index of n=1.54 and the passivation layer is formed of $SiO_2$ having a refractive index of n=1.46 or $MgF_2$ having a refractive index of n=1.38.

FIG. 2 shows an enlarged section of the optoelectronic component 1 according to FIG. 1 and is marked as a square in FIG. 1. The passivation layer 7 has a penetration 9 so that the contact point 10 of the electrically conductive coating 5 is accessible. Furthermore, the penetration is completely filled with the contact agent 6. The contact agent 6 overmolds the passivation layer 7 and projects beyond it in the lateral direction and in the vertical direction.

Figure 3:
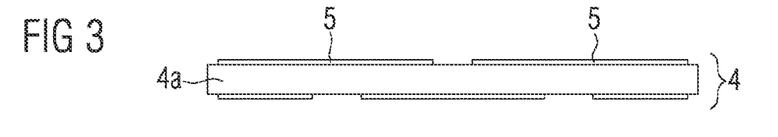
FIGS. 3, 4, 5, 6, 7 and 8 show schematic sectional views of method stages of the method for producing an optoelectronic component according to an exemplary embodiment.

In the method according to the exemplary embodiment of FIGS. 3, 4, 5, 6, 7 and 8, in a first method step according to FIG. 3, the carrier 4 is provided, which comprises the electrically conductive coating 5.

Figure 4:
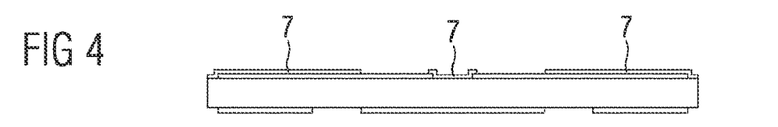

In a further step, the passivation layer 7 is applied to the carrier in a structured manner, as shown in FIG. 4. The passivation layer 7 is in direct contact with the electrically conductive coating 5 and the carrier plate 4a.

Figure 5:
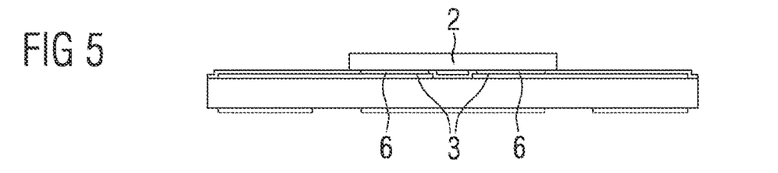

After application of the passivation layer 7, in a further step as shown in FIG. 5, the radiation-emitting semiconductor chip 2, which comprises the electrical contact 3, is provided and electrically conductively connected to the electrically conductive coating 5 by means of the contact agent 6, preferably by soldering. The contact agent 6 is preferably applied here to the electrical contact 3 before the electrical contact 3 is connected to the electrically conductive coating 5. The contact agent 6 is preferably applied as a comparatively thin layer. Advantageously, comparatively small and easily reproducible quantities of the contact agent 6 can thus be applied to the electrical contact 3.

Figure 6:
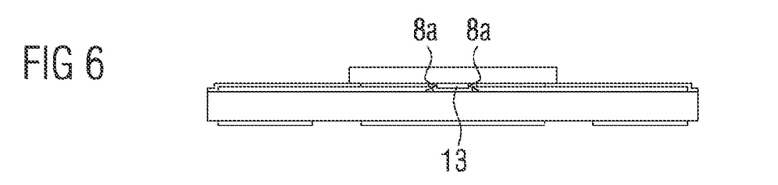

An intermediate space between opposing side surfaces 8a of the electrically conductive coating 5, the radiation-emitting semiconductor chip 2 and the carrier 4 is completely filled with the potting body 13 in a further step according to FIG. 6.

Figure 7:
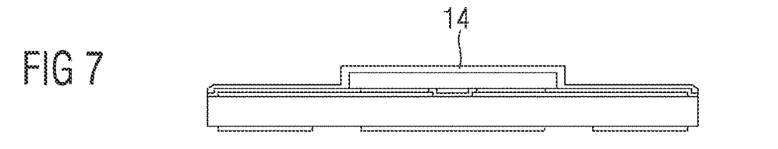
Figure 8:
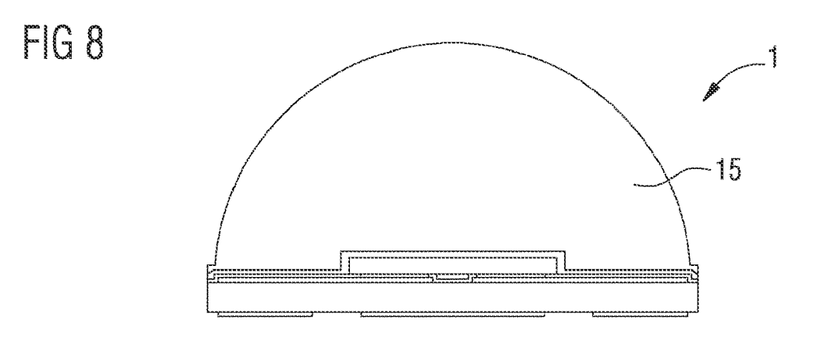

In a further step, according to FIGS. 7 and 8, a conversion element 14 and an optical element 15 are applied over the radiation-emitting semiconductor chip 2 and the passivation layer 7.

Figure 9:
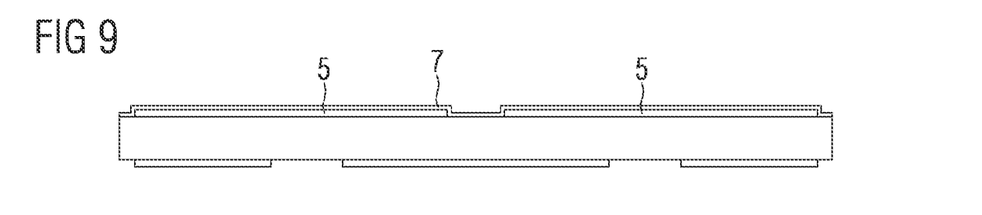
FIGS. 9 and 10 show schematic sectional views of method stages of the method for producing an optoelectronic component according to an exemplary embodiment.
Figure 10:
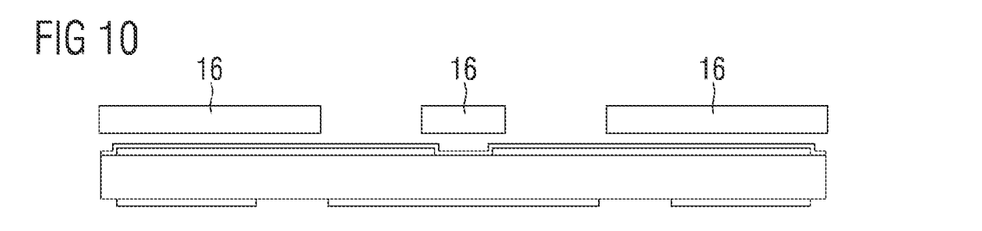

In the method according to the exemplary embodiment of FIGS. 9 and 10, after providing the carrier 4 as shown in FIG. 3, the passivation layer 7 is completely deposited over the carrier 4 (FIG. 9).

In a further step, the passivation layer 7 is structured by means of a shadow mask 16 and a physical etching process (FIG. 10). The passivation layer 7 is structured in the same way as in the exemplary embodiment of FIG. 13.

Figure 11:
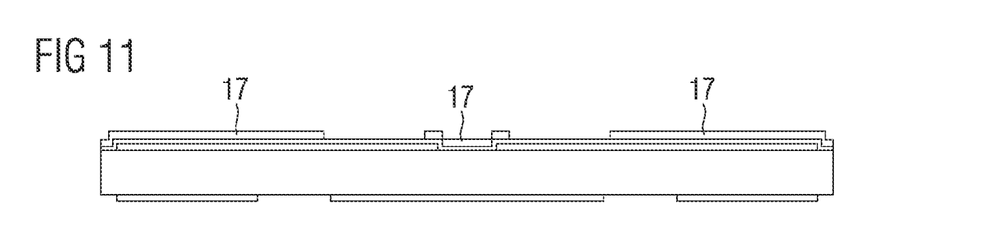
FIGS. 11, 12 and 13 show schematic sectional views of method stages for the production of a structured passivation layer for an optoelectronic component according to an exemplary embodiment.
Figure 12:
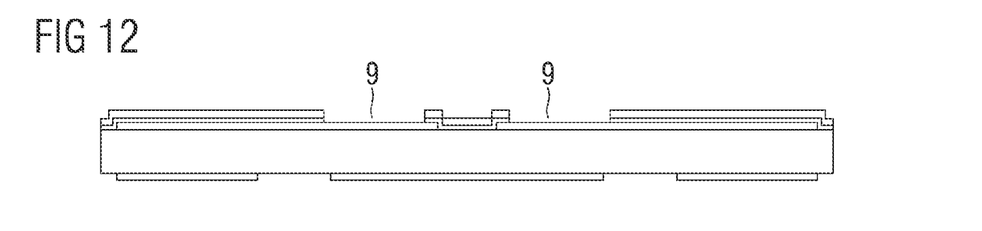
Figure 13:
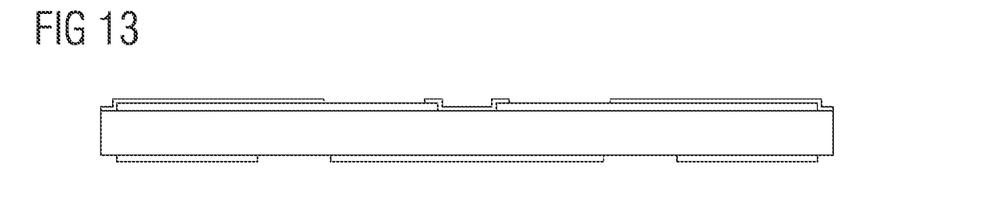

In the method according to the exemplary embodiment of FIGS. 11, 12 and 13, after complete application of the passivation layer, as shown in FIG. 9, a photoresist mask 17, which is for example a positive photoresist, is applied over the passivation layer 7 (FIG. 11).

According to FIG. 12, the regions of the passivation layer 7 not covered by the positive photoresist are removed by means of a chemical etching process, thus creating the penetration 9 in the passivation layer 7.

In a further step, the positive photoresist is removed, as shown in FIG. 13.

Figure 14:
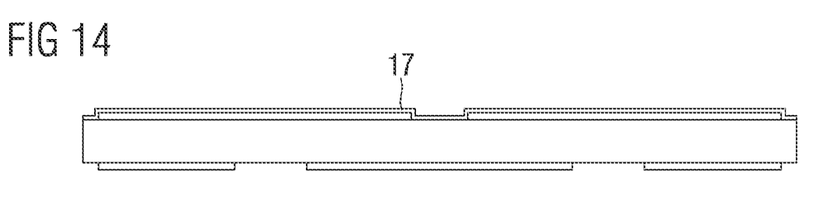
FIGS. 14, 15, 16, 17 and 18 show schematic sectional views of method stages for the production of a structured passivation layer for an optoelectronic component according to an exemplary embodiment.

In the method according to the exemplary embodiment of FIGS. 14, 15, 16, 17 and 18, after providing the carrier 4 as shown in FIG. 3, the photoresist mask 17, which is for example a negative photoresist, is completely applied over the carrier 4, according to FIG. 14.

Figure 15:
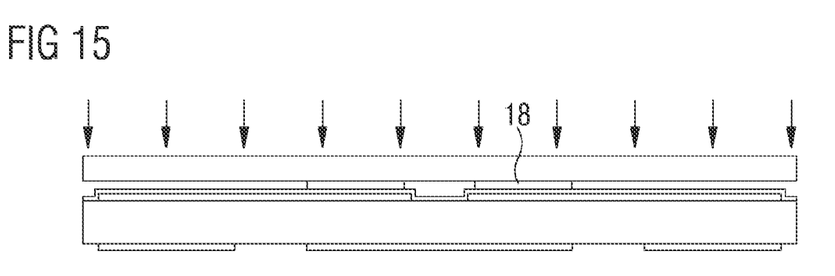

In a further step, according to FIG. 15, a further shadow mask 18 is arranged over the negative photoresist. Further, the negative photoresist is exposed by means of ultraviolet exposure, which is indicated by a plurality of arrows in FIG. 15.

Figure 16:
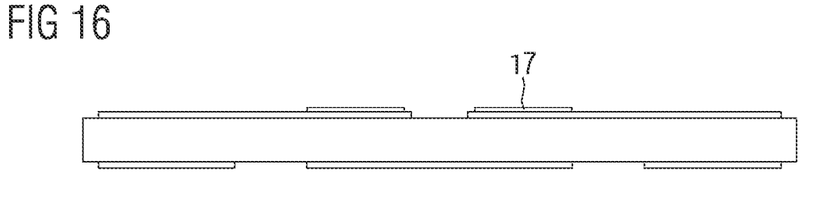

As shown in FIG. 16, the negative photoresist is structured after exposure in such a way that it is arranged only over the regions where the penetration 9 is to be created.

Figure 17:
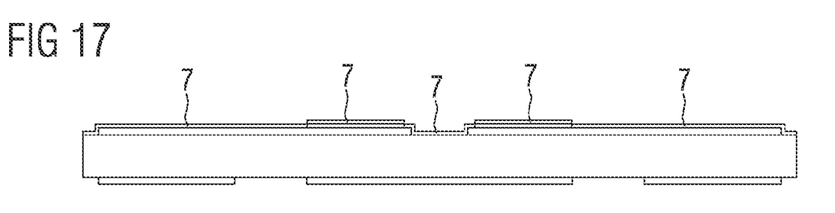

Subsequently, the passivation layer 7 is completely applied over the carrier 4 with the electrically conductive coating 5 and the negative photoresist, as shown in FIG. 17.

Advantageously, the passivation layer 7 is preferably applied to the negative photoresist by vapor deposition or evaporation so that a side surface of the negative photoresist is not completely covered. Advantageously, the negative photoresist can thus be removed more easily (FIG. 18).

Figure 18:
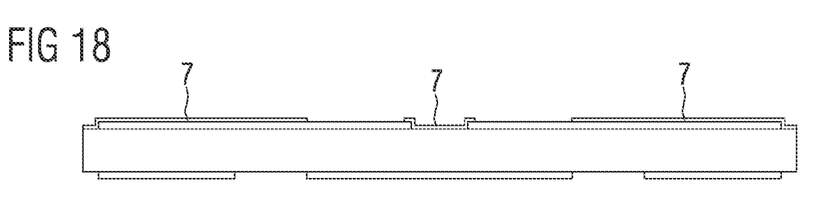

According to FIG. 18, the negative photoresist is removed in a further step. By means of a chemical etching process, the passivation layer 7, which is arranged over the negative photoresist, is also removed.

Figure 19:
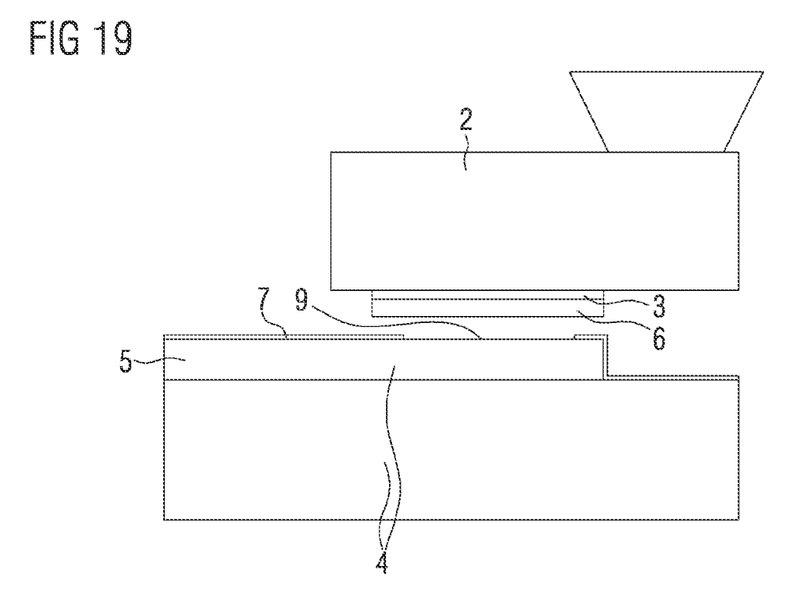
FIGS. 19 and 20 show schematic sectional views of method stages for producing an optoelectronic component according to an exemplary embodiment.
Figure 20:
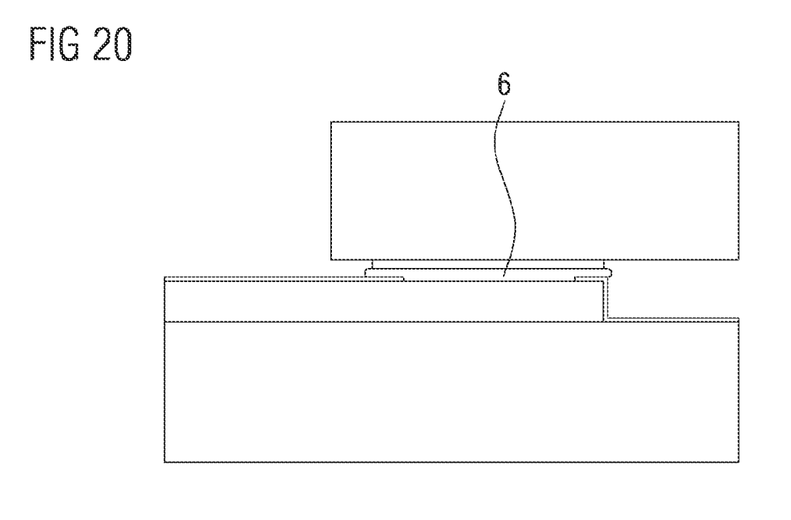

In the method according to the exemplary embodiment of FIGS. 19 and 20, the connection of the radiation-emitting semiconductor chip 2 to the carrier 4 is illustrated.

The contact agent 6 is applied to the electrical contact 3, as shown in FIG. 19. The contact agent 6 completely covers the electrical contact 3. The radiation-emitting semiconductor chip 2 is heated so that the contact agent 6 is in a viscous form.

In a further step according to FIG. 20, the contact agent 6 is pressed centrally into the penetration 10 onto the electrically conductive coating 5 during the connection. The contact agent 6 is thereby pressed against the electrically conductive coating 5 with a constant pressure. The pressing causes the contact agent 6 to be partially displaced from the penetration. The contact agent 6 is thus displaced into the regions of the passivation layer 7 surrounding the penetration 10, so that the contact agent 6 overmolds the passivation layer 7 in the region of the penetration 10.

Figure 21:
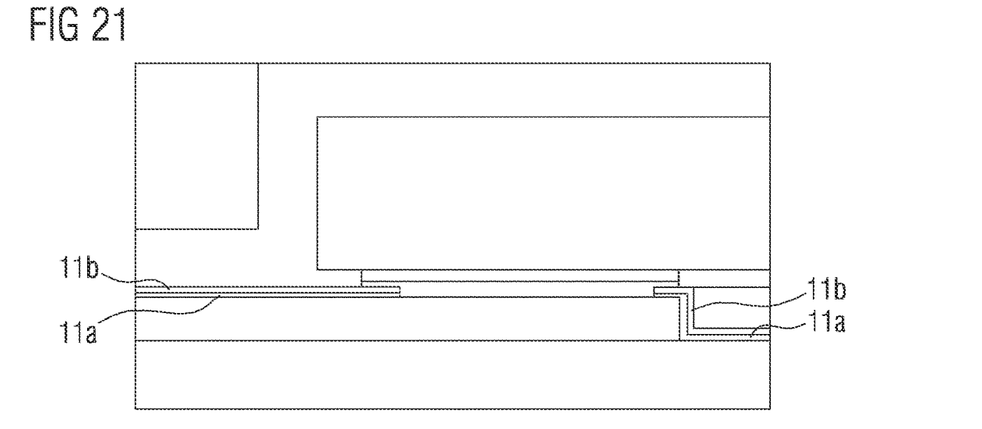
FIGS. 21, 22 and 23 show schematic sectional views of an optoelectronic component each according to an exemplary embodiment.

In the optoelectronic component 1 according to the exemplary embodiment of FIG. 21, the passivation layer 7 is formed as a layer stack comprising a first layer 11a and a second layer 11b, in contrast to the optoelectronic component 1 according to the exemplary embodiment of FIG. 2. For example, the first layer comprises $SiO_2$ and the second layer comprises $Al_2O_3$.

Figure 22:
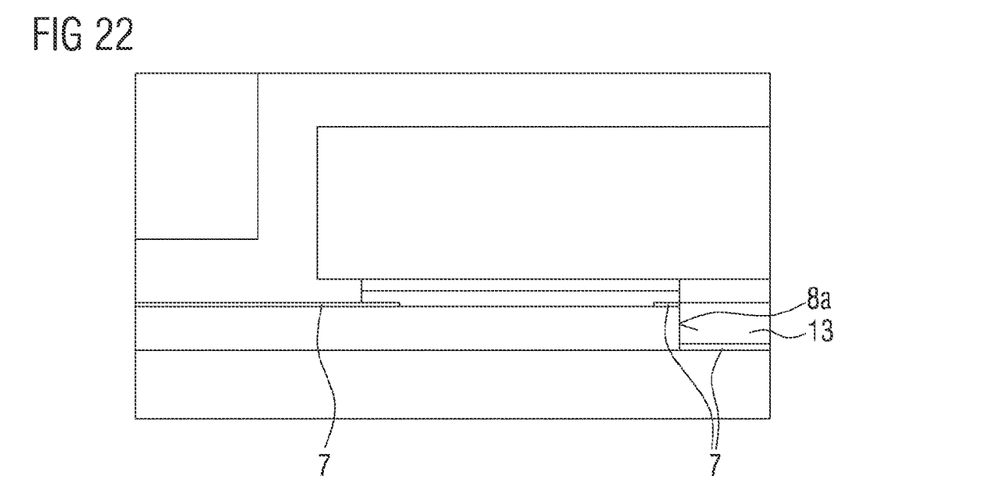

In contrast to the optoelectronic component 1 according to the exemplary embodiment of FIG. 2, the exemplary embodiment of the optoelectronic component 1 according to FIG. 22 has a side surface of the electrically conductive coating 8a that is free of the passivation layer 7. Furthermore, the side surface of the electrically conductive coating 8a that is free of the passivation layer 7 is completely covered by a potting body 13. The potting body 13 comprises, for example, a silicone in which $TiO_2$ particles are incorporated. The outer surface of the electrically conductive coating 8 facing away from the carrier plate 4a is thus completely encapsulated by the passivation layer 7, the contact agent 6 and the potting body 13.

Figure 23:
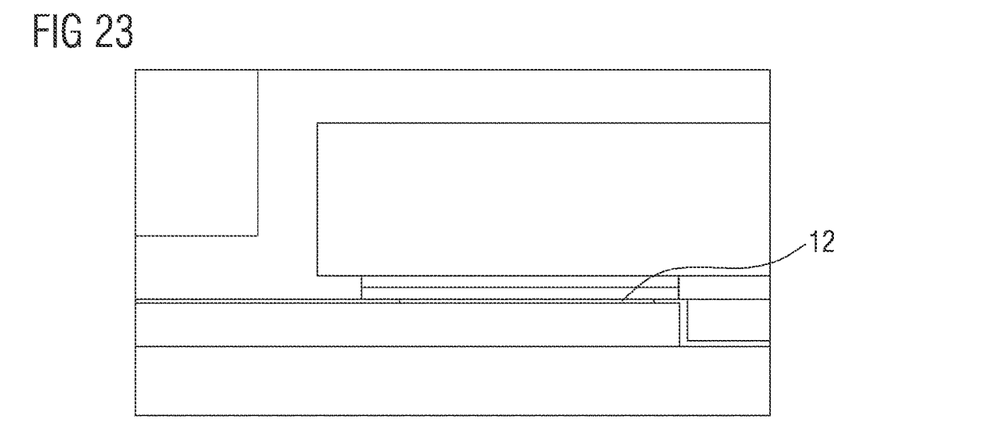

In the optoelectronic component 1 according to the exemplary embodiment of FIG. 23, a metal layer 12 is arranged between the contact agent 6 and the electrically conductive coating 5, in contrast to the optoelectronic component 1 according to the exemplary embodiment of FIG. 2. The metal layer 12 is completely arranged in the penetration 9 and completely fills it. The metal layer 12 further terminates flush with the main surface of the passivation layer 7.

The invention is not limited to the description based on the exemplary embodiments. Rather, the invention comprises any new feature as well as any combination of features, which includes in particular any combination of features in the claims, even if this feature or combination itself is not explicitly stated in the claims or exemplary embodiments.

The invention claimed is:

1. An optoelectronic component comprising:
a semiconductor chip comprising a first electrical contact and a second electrical contact, the semiconductor chip configured to emit primary electromagnetic radiation;
a carrier comprising a first electrically conductive coating and a second electrically conductive coating on which the semiconductor chip with the first and second electrical contacts is arranged;
a conversion element;
a contact agent respectively connecting the first and second electrically conductive coatings of the carrier and the first and second electrical contacts of the semiconductor chip with one another; and
a passivation layer arranged in places on the first and second electrically conductive coatings,
wherein an outer surface of the first and second electrically conductive coatings is completely encapsulated by the passivation layer and the contact agent,
wherein the passivation layer has a penetration,
wherein the contact agent protrudes beyond the penetration in a lateral direction,
wherein the lateral direction extends parallel to a main extension plane of the carrier,
wherein a metal layer is arranged in the penetration between the contact agent and the first and second electrically conductive coatings,
wherein the metal layer terminates flush with a main surface of the passivation layer,
wherein the conversion element is arranged on the semiconductor chip in an intermediate space between opposing side surfaces of the first and second electrically conductive coatings, the semiconductor chip and the carrier, and
wherein the semiconductor chip is a flip chip.

2. The optoelectronic component according to claim 1, wherein the passivation layer includes the penetration so that a contact point of the first and second electrically conductive coatings are accessible, and
wherein the penetration is completely filled with the contact agent.

3. The optoelectronic component according to claim 1, wherein the first and second electrically conductive coatings are configured to be reflective for the primary electromagnetic radiation.

4. The optoelectronic component according to claim 1, wherein the passivation layer comprises a layer stack.

5. The optoelectronic component according to claim 1, wherein the passivation layer is arranged for the most part on the first and second electrically conductive coatings.

6. The optoelectronic component according to claim 1, wherein the intermediate space is additionally filled with a potting body, which is formed of a resin in which reflective particles are incorporated.

7. The optoelectronic component according to claim 1, wherein a side surface of the first and second electrically conductive coatings is free of the passivation layer, and
wherein the side surface of the first and second electrically conductive coatings, which is free of the passivation layer, is completely covered by a potting body.

8. The optoelectronic component according to claim 1, wherein the semiconductor chip is surrounded by the conversion element configured to convert the primary electromagnetic radiation into secondary electromagnetic radiation of a different wavelength range.

9. The optoelectronic component according to claim 8, further comprising an optical element is arranged downstream of the semiconductor chip.

10. The optoelectronic component according to claim 9, wherein the passivation layer has a smaller refractive index than the optical element and/or the conversion element.

11. The optoelectronic component according to claim 1, wherein the first electrically conductive coating is spaced apart at most by 100 micrometers in lateral directions from the second electrically conductive coating.

12. A method for producing an optoelectronic component, the method comprising:
providing a carrier comprising a first electrically conductive coating and a second electrically conductive coating;
providing a passivation layer on the carrier;
providing a radiation-emitting semiconductor chip comprising a first electrical contact and a second electrical contact, wherein a contact agent is applied to the first and second electrical contacts, and wherein the contact agent completely covers the first and second electrical contacts;
connecting the radiation-emitting semiconductor chip to the carrier via the contact agent,
wherein an outer surface of the first and second electrically conductive coatings is completely encapsulated by the passivation layer and the contact agent,
wherein the passivation layer has a penetration,
wherein the contact agent protrudes beyond the penetration in a lateral direction, and
wherein the lateral direction extends parallel to a main extension plane of the carrier; and
arranging a conversion element on the radiation-emitting semiconductor chip in an intermediate space between opposing side surfaces of the first and second electrically conductive coatings, the radiation-emitting semiconductor chip and the carrier,
wherein the radiation-emitting semiconductor chip is a flip chip.

13. The method according to claim 12, wherein a contact point of the first and second electrically conductive coatings is accessible in a region of the penetration.

14. The method according to claim 13,
wherein the contact agent is applied to the first and second electrical contacts, and
wherein the contact agent is pressed onto the contact point of the first and second electrically conductive coatings while connecting so that the contact agent protrudes beyond regions of the passivation layer surrounding the penetration.

15. The method according to claim 14, further comprising heating the radiation-emitting semiconductor chip while connecting.

16. The method according to claim 13, further comprising, prior to connecting, depositing a metal layer by an electroplating process on the contact point of the first and second electrically conductive coatings.

17. The method according to claim 12, further comprising structuring the passivation layer by a shadow mask and a physical etching process.

18. The method according to claim 12, further comprising structuring the passivation layer by a photoresist mask and a chemical etching process.

19. An optoelectronic component comprising:
a semiconductor chip comprising a first electrical contact and a second electrical contact, the semiconductor chip configured to emit primary electromagnetic radiation;
a carrier comprising a first electrically conductive coating and a second electrically conductive coating on which the semiconductor chip with the first and second electrical contacts is arranged;
a conversion element;
a contact agent connecting the first and second electrically conductive coatings of the carrier and the first and second electrical contacts of the semiconductor chip with one another; and
a passivation layer arranged in places on the first and second electrically conductive coatings,
wherein an outer surface of the first and second electrically conductive coatings is completely encapsulated by the passivation layer and the contact agent,
wherein the passivation layer has a penetration,
wherein the contact agent protrudes beyond the penetration in a lateral direction,
wherein the lateral direction extends parallel to a main extension plane of the carrier,
wherein the passivation layer comprises a layer stack including a first layer and a second layer,
wherein each of the first layer and the second layer comprises $SiO_2$, $MgF_2$ or $Al_2O_3$,
wherein the conversion element is arranged on the semiconductor chip in an intermediate space between opposing side surfaces of the first and second electrically conductive coatings, the semiconductor chip and the carrier, and
wherein the semiconductor chip is a flip chip.

20. The optoelectronic component according to claim 19, wherein the first layer comprises $SiO_2$ and the second layer comprises $Al_2O_3$.

* * * * *